United States Patent
Barth et al.

(10) Patent No.: US 7,449,409 B2
(45) Date of Patent: Nov. 11, 2008

(54) BARRIER LAYER FOR CONDUCTIVE FEATURES

(75) Inventors: Hans-Joachim Barth, Munich (DE); Juergen Holz, Dresden (DE)

(73) Assignee: Infineon Technologies AG, Munich (DE)

(*) Notice: Subject to any disclaimer, the term of this patent is extended or adjusted under 35 U.S.C. 154(b) by 91 days.

(21) Appl. No.: 11/079,738

(22) Filed: Mar. 14, 2005

(65) Prior Publication Data

US 2006/0202345 A1 Sep. 14, 2006

(51) Int. Cl.
*H01L 21/4763* (2006.01)
(52) U.S. Cl. .............. 438/627; 438/597; 438/622; 438/625; 438/672; 438/643
(58) Field of Classification Search ............. 438/627, 438/622, 597, 625, 672, 643
See application file for complete search history.

(56) References Cited

U.S. PATENT DOCUMENTS

| | | | |
|---|---|---|---|
| 6,093,966 A * | 7/2000 | Venkatraman et al. | 257/751 |
| 6,281,121 B1 | 8/2001 | Brown et al. | |
| 6,297,154 B1 | 10/2001 | Gross et al. | |
| 6,380,083 B1 | 4/2002 | Gross | |
| 6,437,440 B1 | 8/2002 | Cabral, Jr. et al. | |
| 6,607,977 B1 * | 8/2003 | Rozbicki et al. | 438/627 |
| 6,727,592 B1 | 4/2004 | Woo et al. | |
| 6,753,610 B1 * | 6/2004 | Fukiage | 257/762 |
| 6,900,539 B2 * | 5/2005 | Motoyama | 257/751 |
| 7,193,327 B2 * | 3/2007 | Yu et al. | 257/774 |
| 2003/0087490 A1 | 5/2003 | Abe | |
| 2003/0089597 A1 | 5/2003 | Tang et al. | |
| 2004/0131878 A1 | 7/2004 | Seet et al. | |
| 2004/0251556 A1 | 12/2004 | Yang et al. | |
| 2006/0024953 A1 * | 2/2006 | Reo et al. | 438/629 |
| 2006/0099802 A1 * | 5/2006 | Lin et al. | 438/637 |

FOREIGN PATENT DOCUMENTS

| | | |
|---|---|---|
| EP | 0 751 566 A2 | 6/1996 |
| EP | 0 982 771 A1 | 3/2000 |

OTHER PUBLICATIONS

Barnat, E.V., et al., "Real Time Copper Resistivity Measurements During Sputter Deposition," Proceedings of 2001 IITC Conference, 2001, pp. 24-26, IEEE.
Jiang, Q.T., et al., "Line Width Dependence of Copper Resistivity,"Proceedings of 2001 IITC Conference, 2001, pp. 227-229, IEEE.
Zscheche, E., et al., "Microstructure Characterization of Metal Interconnects and Barrier Layers: Status and Future," Proceedings of 2000 IITC Conference, 2000, pp. 233-235, IEEE.

* cited by examiner

*Primary Examiner*—Long Pham
(74) *Attorney, Agent, or Firm*—Slater Matsil, L.L.P.

(57) ABSTRACT

Barrier layers for conductive features and methods of formation thereof are disclosed. A first barrier material is deposited on top surfaces of an insulating material, and a second barrier material is deposited on sidewalls of the insulating material, wherein the second barrier material is different than the first barrier material. The first barrier material induces grain growth of a subsequently deposited conductive material at a first rate, and the second barrier material induces grain growth of the conductive material at a second rate, wherein the second rate is slower than the first rate.

17 Claims, 4 Drawing Sheets

BARRIER LAYER FOR CONDUCTIVE FEATURES

TECHNICAL FIELD

The present invention relates generally to the fabrication of semiconductor devices, and more particularly to the formation of barrier layers for conductive features of integrated circuits.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

As technology has progressed, the demand for smaller semiconductor devices with improved performance has increased. A move is being made away from the traditional materials used in the past in semiconductor device designs, in order to meet these demands. For example, in the past, aluminum and aluminum alloys were most often used as a conductive material for conductive lines and vias in metallization structures, and silicon dioxide was used as an insulator between conductive lines and vias. However, as semiconductor devices have been scaled down in size, conductive features made from these materials have exhibited an increase in propagation delay.

For example, as minimum feature size decreases, RC time delay begins to limit the propagation delay of integrated circuits. RC time delay refers to the product of the metal resistance (R) and the dielectric capacitance (C). To reduce the RC time delay, low dielectric constant materials are being used as insulating materials, and there is a switch being made to the use of copper for interconnect materials, rather than aluminum.

One advantage of switching from aluminum to copper for semiconductor device interconnects is increased speed. Because the use of copper decreases the RC time delay due to the decreased resistivity of copper, devices can operate faster. There are also other advantages of switching to copper interconnects. For example, copper has a lower resistivity and increased electromigration resistance compared to aluminum. The reduced resistivity of copper results in the ability to manufacture thinner conductive lines, reducing the sidewall capacitance of the conductive lines. Also, because copper has improved electromigration resistance, higher current densities may be used. Combining copper interconnects with low-k dielectric materials increases interconnect speed by reducing the RC time delay, for example.

However, there are some challenges in using copper for an interconnect material. It is difficult to directly etch copper, e.g., in a subtractive etch process, and thus, copper interconnects are often formed using damascene processes rather than by direct etching. A damascene process is one in which a dielectric material is deposited on a wafer, and then the dielectric material is patterned with the desired conductive line pattern. The conductive line pattern typically comprises a plurality of trenches, for example. The trenches are then filled in with conductive material, and a chemical-mechanical polish (CMP) process is used to remove the excess conductive material from the top surface of the dielectric material. The conductive material remaining within the dielectric material comprises the conductive lines.

Damascene processes are typically either single or dual damascene. In a single damascene process, one metal layer is formed at a time. For example, the insulating layer is patterned and then filled with metal, and a CMP process is used to form a single metal layer. In a dual damascene process, two adjacent horizontal insulating layers are patterned, e.g., using two lithography patterns in the two insulating layers or a single insulating layer. The patterned insulating layer(s) are filled with metal, and a CMP process is used to remove excess conductive material, leaving the conductive material in the patterned insulating layer(s). For example, the patterns may comprise conductive lines in a top insulating layer portion, and vias in an underlying bottom insulating layer portion. The vias may connect the conductive lines to devices or interconnect layers that reside in the underlying insulating layer, for example. Thus, in a dual damascene process, conductor and via trenches are filled in one fill step.

Because copper diffuses easily into some dielectric materials, especially some types of low-k dielectric materials, a barrier layer is usually deposited over the insulating material before the copper is formed. However, barrier layers have a tendency to increase the resistance of the copper conductive lines, especially in small, narrow features.

Thus, what are needed in the art are improved barrier layers, and methods of forming thereof, for conductive features of semiconductor devices.

SUMMARY OF THE INVENTION

These and other problems are generally solved or circumvented, and technical advantages are generally achieved, by preferred embodiments of the present invention, which provide novel structures and methods of forming barrier layers for conductive features of semiconductor devices. Small conductive features may be formed that have reduced resistance and larger grain size.

In accordance with a preferred embodiment of the present invention, a semiconductor device includes a workpiece and an insulating material disposed over the workpiece. The insulating material has a first top surface and at least one trench formed therein, the at least one trench extending below the first top surface of the insulating material and comprising sidewalls. The at least one trench has a second top surface disposed at the bottom of the at least one trench. A first barrier material is disposed over at least the second top surface, and a second barrier material is disposed over the sidewalls, wherein the second barrier material comprises a different material than the first barrier material.

In accordance with another preferred embodiment of the present invention, a method of manufacturing a semiconductor device includes providing a workpiece, forming an insulating material over the workpiece, the insulating material having a first top surface, and forming at least one trench in the insulating material. The at least one trench extends below the first top surface of the insulating material and comprises sidewalls. The at least one trench has a second top surface disposed at the bottom of the at least one trench. The method includes forming a first barrier material over at least the second top surface, and forming a second barrier material over the sidewalls, wherein the second barrier material comprises a different material than the first barrier material. The at least one trench is filled with a conductive material.

Advantages of preferred embodiments of the present invention include providing barrier layers wherein the barrier layer material is different on the sidewalls of trenches than at the top surfaces, inducing larger grain growth of the crystalline structure of conductive material within the trenches. The conductive features formed have a low resistance and thus have increased conductivity, enabling the manufacture of faster, higher performance integrated circuits.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
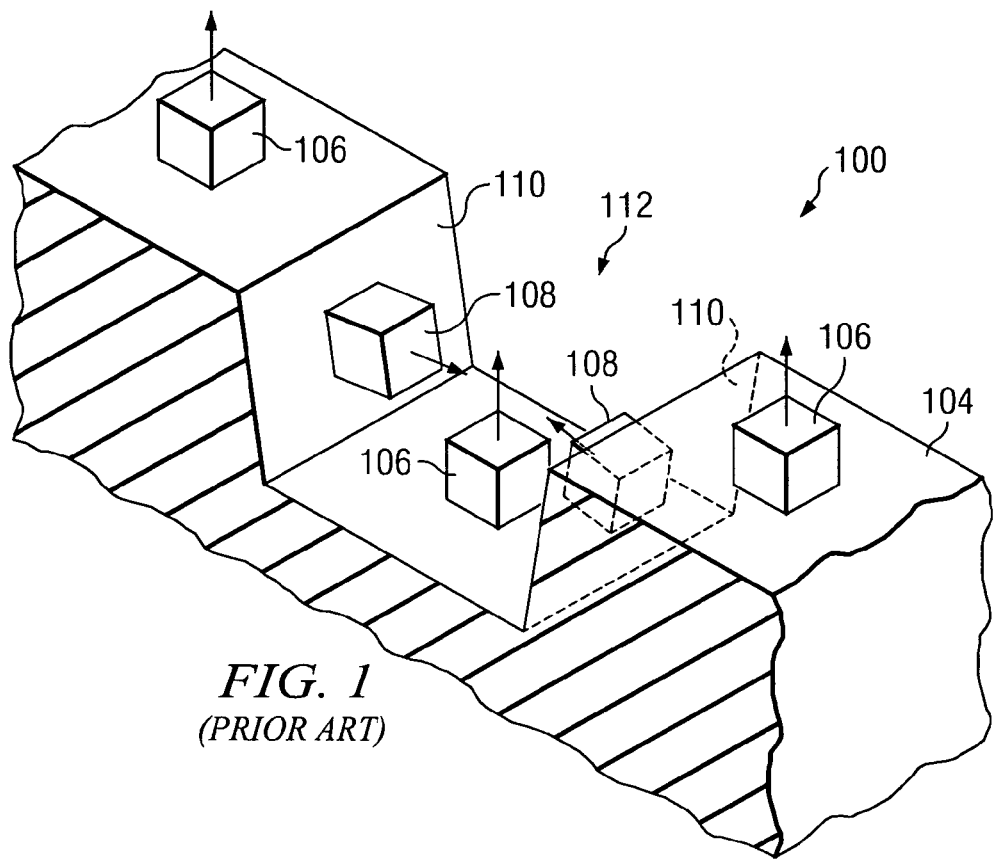
FIG. 1 is a perspective view of a prior art single damascene structure, showing the typical nucleation of copper grains at the bottom and sidewall of a trench as copper is formed.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Prior art methods of fabricating conductive features will first be described. Lithography and etching processes are used to pattern vias and trenches, in single damascene or dual damascene structures in a dielectric material, which may comprise an oxide, fluorinated silicon glass (FSG), or a dense or porous low k dielectric material, as examples. After etching, resist strip & cleaning the dielectric material, a metallic barrier is deposited over the patterned dielectric material using physical vapor deposition (PVD), chemical vapor deposition (CVD), atomic layer deposition (ALD), or other deposition methods adapted to provide thin and continuous metallic barrier films at the bottom and the sidewalls of the patterned features. Typical barrier materials used in the art include Ta, TaN, TaC, Ti, TiN, TiSiN, TiZr, TiZrN, W, WN, WCN, and Ru, as examples. One commonly used barrier layer is a combination of a thin hexagonal TaN layer followed by a thin layer of Ta in a low resistive alpha phase, deposited by PVD, as described in U.S. Pat. No. 6,437,440, entitled, "Thin Film Metal Barrier for Electrical Interconnections", issued on Aug. 20, 2002 to Cabral, Jr. et al., which is incorporated herein by reference. The alpha-Ta barrier on top of hexagonal TaN has been found to provide a good nucleation layer for subsequently deposited copper films with a preferred <111> texture. Copper lines with a <111> texture, i.e., with their <111> plane normal parallel to the surface normal have been found to show good reliability and electromigration performance, for example.

After the barrier layer is formed over the dielectric material, the next step is the deposition of a conductive material such as copper or a copper-alloy film by PVD, CVD, electroplating, electroless plating, or other methods. Typically, a PVD copper seed layer is deposited on top of the metallic barrier followed by an electrochemical deposition (electroplating) of the conductive material comprising a copper film in and above the damascene pattern. The excess conductive material and metallic barrier outside of the damascene features is removed by a copper and barrier CMP process.

A problem with prior art damascene copper conductive features is a dramatic increase in the resistivity of copper interconnects in narrow features, e.g., such as features having less than 0.1 μm line width or thickness, for example. The reason for the resistivity increase is the small grain size of copper grains in narrow lines or thin films, as described in a paper entitled, "Line Width Dependence of Copper Resistivity," by Q. T. Jiang et al., in the Proceedings of 2001 IITC Conference, pp. 227 to 229, and also in a paper entitled, "Real Time Copper Resistivity Measurements During Sputter Deposition", by E. V. Barnat et al., in the Proceedings of 2001 IITC Conference, pp. 24 to 26, which papers are incorporated herein by reference. In such small dimensions, the copper grain size is typically comparable to the line width or film thickness, whichever is smaller. With a mean free path for conduction electrons in copper of approximately 50 nm, this leads to an increased grain boundary scattering of the conduction electrons and the above-mentioned resistivity increase in the interconnects.

In narrow damascene features, such as dual damascene features, with a metallic barrier on the sidewalls and on the via and trench bottom surface, there are competing nucleation sites for the growth of the preferred <111> oriented copper grains. In narrow features with higher aspect ratios, e.g., having an aspect ratio (AR) of greater than about 0.5, the growth of copper grains nucleated at the sidewall becomes an important factor in degrading the overall <111> texture relative to the trench bottom and to the planar surfaces and leading in addition to smaller grain sizes, as described in a paper entitled, "Microstructure Characterization of Metal Interconnects and Barrier Layers: Status and Future," by E. Zschech et al., in the Proceedings of 2000 IITC Conference, pp. 233 to 235, which paper is incorporated herein by reference.

Figure 2:
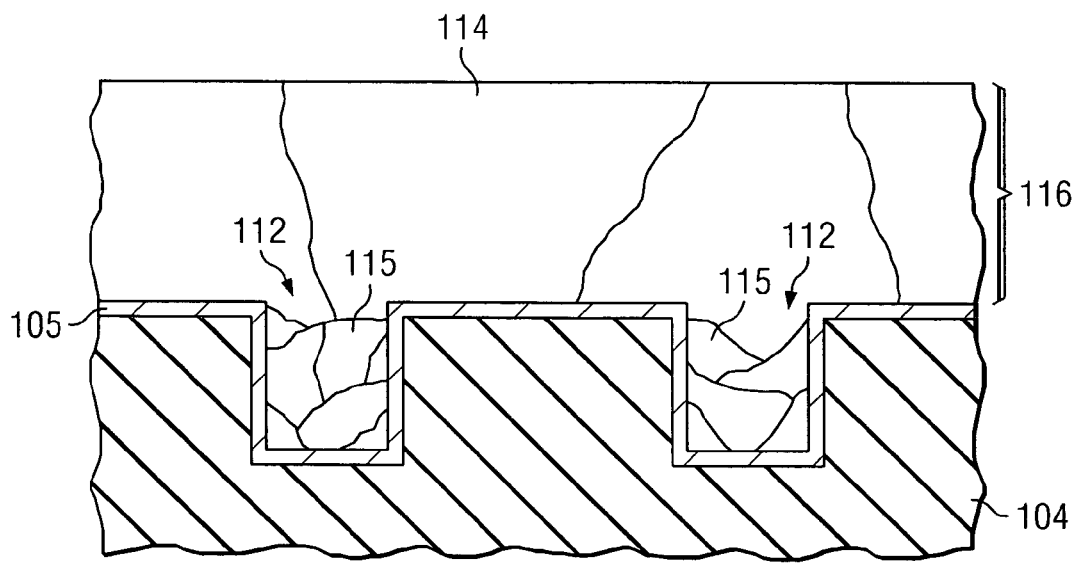
FIG. 2 is a cross-sectional view of a prior art copper damascene structure, having smaller grains formed in trenches, which increases the resistance of the conductive features.

FIG. 1 is a perspective view of a prior art semiconductor device 100 having a single damascene structure, showing the typical nucleation of copper grains at the bottom and sidewall of a trench 112 formed in an insulating layer 104 as copper is formed. The grains 106 at the top surfaces are oriented at a <111> crystalline plane, and the grains 108 on the trench sidewalls 110 are oriented at a plane other than <111>, for example. Growth competition between grains 106 and 108 of different original orientation leads to small grains 115 in narrow features within trenches 112, as shown in a cross-sectional view in FIG. 2. The grains 114 of copper in the overburden region 116 (which will later be removed by a CMP process, for example) are larger than the grains 115 in the trenches 112. A prior art metallic barrier layer 105 is also shown in FIG. 2.

Particularly in pattern geometries of less than about 0.1 μm, the competing grain effect leads to a significant resistivity increase of the copper film, because of the limited and competing copper grain growth in the narrow features. The copper grain nucleation at the sidewalls causes the increase in resistance of the copper film. In addition, the electromigration (EM) performance of the copper film is degraded because of the less pronounced <111> texture relative to the planar surfaces, for example. Because there is a different texture in the narrow trenches compared to the copper overburden region 116, there is hardly any joining of copper grains likely during a post-electroplating anneal process of the copper film, for example.

Embodiments of the present invention achieve technical advantages by forming a different barrier layer material over the sidewalls of trenches than over top surfaces. The barrier layer over the sidewalls of a trench induces the grain growth of a conductive material at a slower rate than the barrier layer over the bottom surface of the trench, resulting in larger grains of conductive material being formed within the trench. The barrier layers comprise metal barriers with different nucleation, i.e., a different speed of copper or other conductive material grain growth, at the vertical trench/via sidewall, compared to the bottom of the narrow trenches or vias. The growth of copper grains nucleated at the sidewalls is slower compared to the growth of copper grains nucleated at the trench/via bottom or the planar surface on top of the dielectric, for example.

The present invention will be described with respect to preferred embodiments in a specific context, namely with respect to the fabrication of single damascene conductive features. The invention may also be applied, however, to other methods of fabricating conductive features, such as dual damascene structures and subtractive methods of forming conductive features of semiconductor devices, as examples (not shown in the figures).

Figure 3:
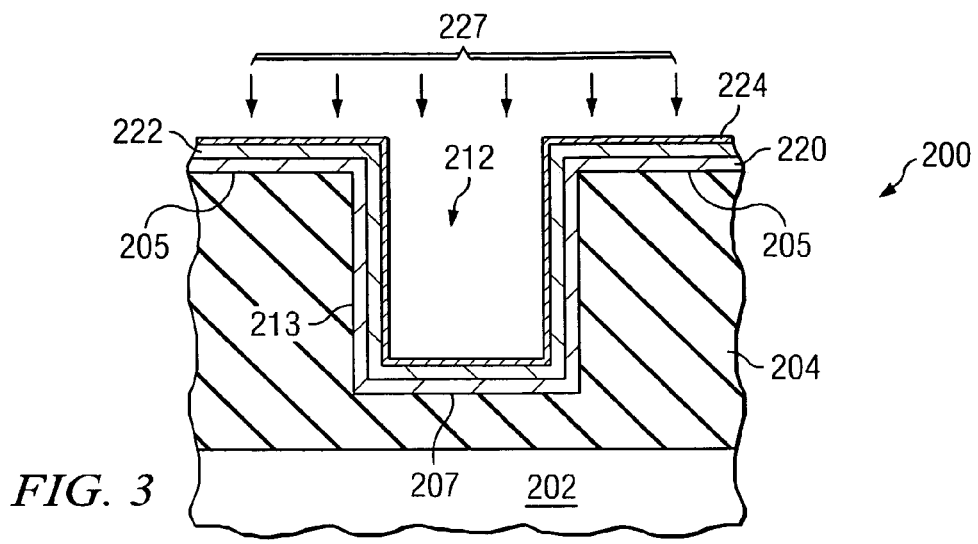
FIGS. 3 through 6 show cross-sectional views of a preferred embodiment of the present invention at various stages of manufacturing.

FIGS. 3 through 6 show cross-sectional views of a preferred embodiment of the present invention at various stages of manufacturing. Referring to FIG. 3, to manufacture a semiconductor device 200, first, a workpiece 202 is provided. The workpiece 202 may include a semiconductor substrate comprising silicon or other semiconductor materials covered by an insulating material layer, for example. The workpiece 202 preferably includes active areas comprising electrical components and/or circuits formed over and/or within the workpiece 202, not shown. The workpiece 202 may comprise silicon oxide over single-crystal silicon, for example. The workpiece 202 may include other conductive layers or other semiconductor elements, e.g., transistors, diodes, etc., not shown. Compound semiconductors, GaAs, InP, Si/Ge, or SiC, as examples, may be used in place of silicon. The workpiece 202 may also comprise a silicon-on-insulator (SOI) substrate, for example.

An insulating material 204 is deposited or formed over the workpiece 202, as shown. The insulating material 204 preferably comprises a dielectric material such as silicon dioxide, FSG, low-k materials, or other insulators, as examples, although alternatively, the insulating material 204 may comprise other materials. The insulating material 204 has a top surface 205. The insulating material 204 may comprise a combination of dielectric materials including hard masks, etch stop layers, and cap layers, not shown.

The insulating material 204 is patterned with a desired pattern for conductive features, e.g., in a single damascene process, as shown. The patterning process may include depositing a photoresist, patterning the photoresist, using the photoresist as a mask while the insulating material 204 is etched, a strip process to remove the photoresist, and a cleaning process, for example. The insulating material 204 may be patterned with a plurality of trenches 212, for example, as shown. Only one trench 212 is shown in FIG. 3; however, there may be many trenches 212 formed on a single semiconductor device 200, for example. The trench 212 extends below the top surface 205 of the insulating material 204, as shown. Each trench 212 comprises sidewalls 213 and a top surface 207 at the bottom of the trench 212, for example.

In accordance with embodiments of the present invention, a first barrier material is formed over the top surface 205 of the insulating material 204 and the top surface 207 within the trench 212. A second barrier material is formed over the sidewalls 213 of the trenches 212, wherein the second barrier material comprises a different material than the first barrier material.

In the embodiment shown in FIGS. 3 through 6, the first barrier material comprises a first layer 220 of TaN in a hexagonal phase and a second layer 222 of Ta in an alpha phase disposed over the first layer 220 of TaN in a hexagonal phase. The second barrier material comprises the first layer of TaN 220 in a hexagonal phase and the second layer 222 of Ta in an alpha phase disposed over the first layer of TaN in a hexagonal phase, and further comprises a third barrier material 224 disposed over the second layer 222 of Ta in an alpha phase. The third barrier material 224 preferably comprises a different material than the second layer 222 of Ta.

Preferably, the first layer 220 of TaN in a hexagonal phase is deposited over the insulating material 204. The first layer 220 preferably comprises a thickness of about 0.5 to 10 nm, and more preferably comprises a thickness of about 10 nm or less, for example, although the first layer 220 may alternatively comprise other dimensions. The second layer 222 of Ta in an alpha phase is deposited over the first layer 220 of TaN in a hexagonal phase. The second layer 222 of Ta preferably nucleates in the alpha-Ta phase, for example. The second layer 222 preferably comprises a thickness of about 1 to 20 nm, and more preferably comprises a thickness of about 20 nm or less, for example, although the second layer 222 may alternatively comprise other dimensions.

The third barrier material 224 is deposited over the second layer 222, as shown in FIG. 3. The third barrier material 224 comprises a material in an amorphous phase in one embodiment, and preferably comprises a thickness of about 2 nm or less, for example, although alternatively, the third barrier material 224 may comprise other dimensions. The third barrier material 224 is preferably thinner than the first layer 220 and the second layer 222, for example. The third barrier material 224 is preferably deposited using ALD, although alternatively, other deposition methods may be used, for example. In one embodiment, the third barrier material 224 preferably comprises WCN. In this embodiment, the third barrier material 224 may be crystalline rather than amorphous, for example. In other embodiments, the third barrier material 224 may comprise TiN, TiSiN, TiZr, TiZrN, Ru, WN, W, CoWP, CoWB, NiMoP, or TaN, as examples, although the third barrier material 224 may alternatively comprise other materials. The third barrier material 224 preferably comprises a material upon which copper or other conductive material will grow at a slower rate on than the copper or other conductive material will grow on the second layer 222 of Ta in an alpha phase, for example.

Figure 4:
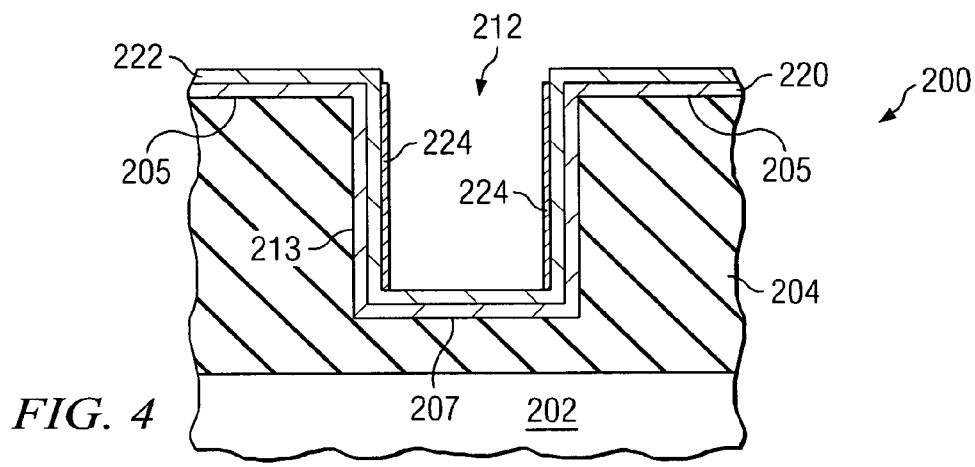

The third barrier material 224 is then removed from over the top surfaces 205 and 207, leaving the third barrier material 224 over the sidewalls 213 of the trenches 212, as shown in FIG. 4. For example, an etch process 227 may be used to remove the third barrier material 224 from the top surfaces 205 and 207. The etch process 227 may comprise an anisotropic etch process, for example. The etch process 227 may comprise a selective etch back or re-sputter process, for example. The second layer 222 of Ta in an alpha phase is left exposed on the top surfaces 205 and 207, as shown.

Figure 5:
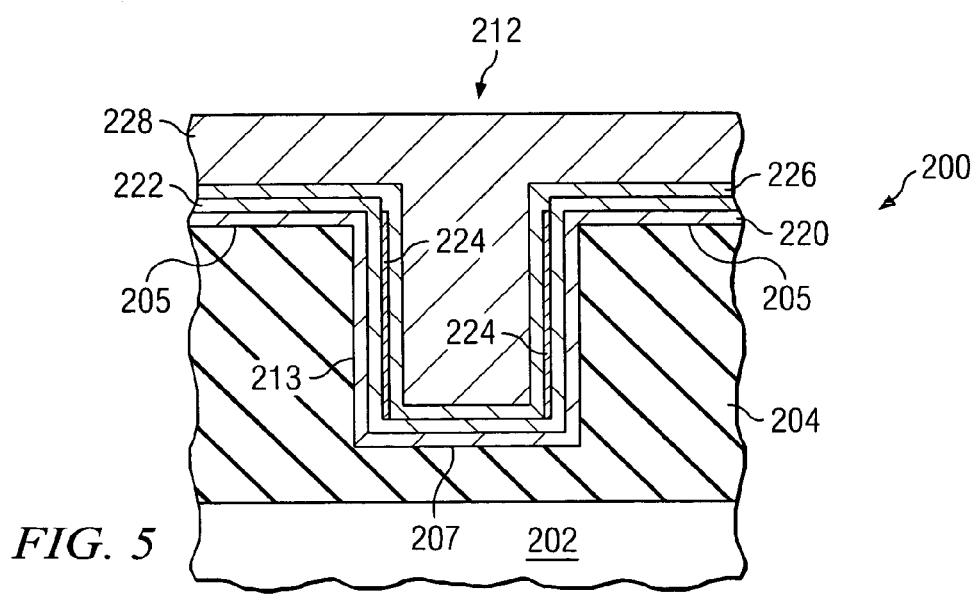

Next, a conductive material 228 is formed over the semiconductor device 200, as shown in FIG. 5. The conductive material 228 preferably comprises copper, although the conductive material 228 may alternatively comprise copper, aluminum, tungsten, silver, gold, or alloys or combinations thereof, for example. The conductive material 228 may be deposited using an electroplating process or electro-chemical process, although other deposition techniques may also be used, for example. An optional seed layer 226 may be formed over the layers 222 and 224 before the conductive material 228 is deposited, as shown. The seed layer 226 may comprise copper, for example, although alternatively, the seed layer 226 may comprise other conductive materials. The optional seed layer 226 may be deposited by PVD, or alternatively by CVD, electroplating or electro-less plating, as examples, and the deposition process may include seed enhancement techniques, for example.

Preferably the grain growth rate of the conductive material 228 is about two times or greater faster over the barrier material 220/222 on the top surfaces 205 and 207, than the grain growth rate of the conductive material 228 over the barrier material 220/222/224 on the sidewalls 213 of trenches 212, in accordance with embodiments of the present invention, for example.

After depositing the conductive material 228, the device 200 may be annealed, e.g., at a temperature of about 100° C. to about 450° C., although alternatively, other temperatures may be used. The anneal process supports grain growth and orientation of <111> texture of the conductive material 228, which may comprise copper, for example.

Figure 6:
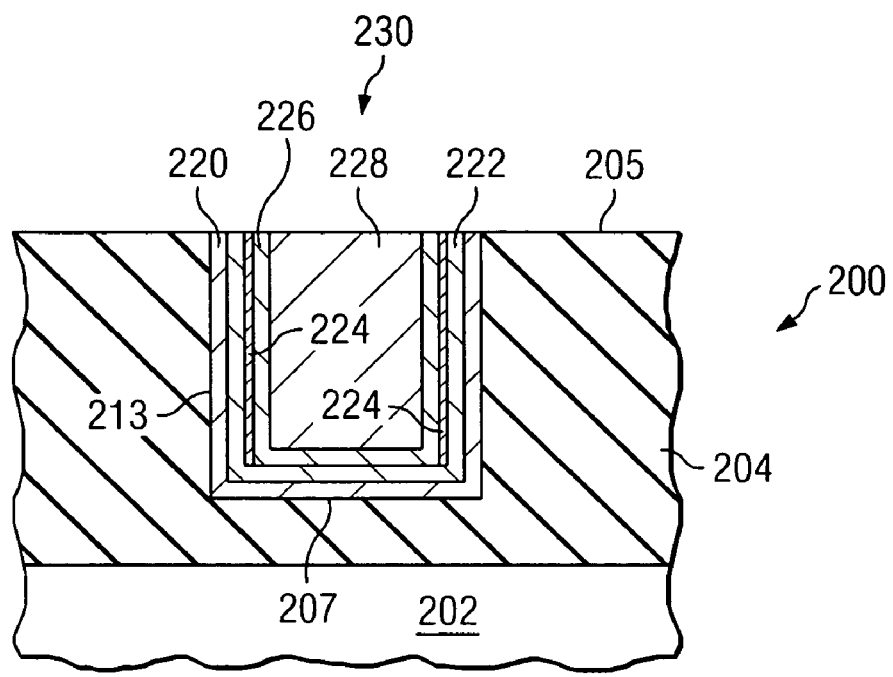

Excess conductive material 228, seed layer 226, and layers 220 and 222 are removed from the top surface 205 of the insulating material 204, e.g., using a CMP process and/or etch process, leaving the semiconductor device 200 shown in FIG. 6 having a conductive feature 230 formed in the insulating material 204.

Figure 7:
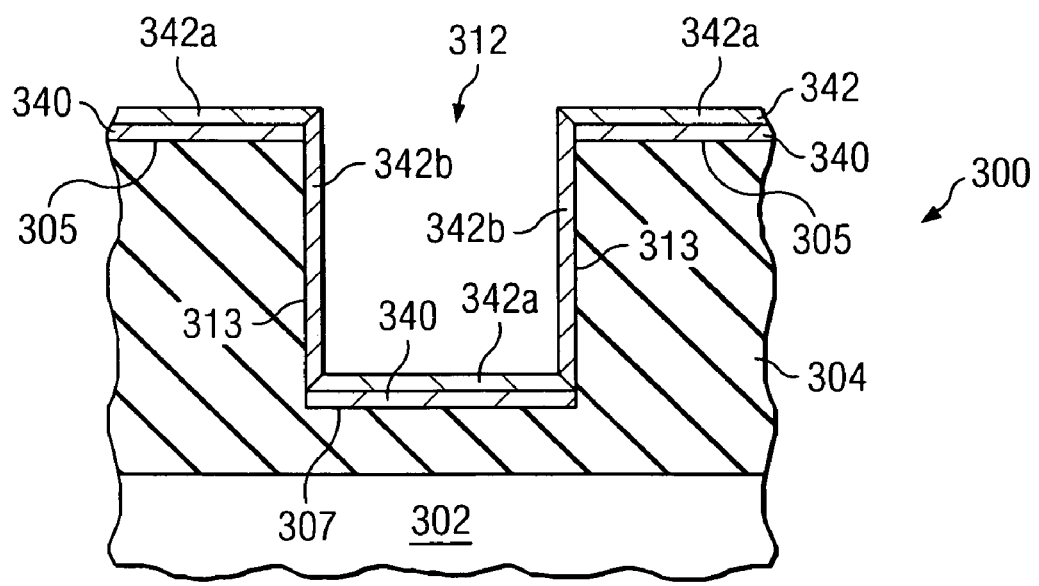
FIG. 7 shows a cross-sectional view of yet another embodiment of the present invention.

FIG. 7 shows another embodiment 300 of the present invention. Like numerals are used in FIG. 7 as were used in the embodiment shown in FIGS. 3 through 6. In this embodiment, a highly directional layer 340 of TaN in a hexagonal phase is formed only on the trench 312 bottom surface 307 and the insulating material 304 top surface 305, but not on the sidewalls 313 of the trenches 312. The directional layer 340 of TaN may be formed only on the planar top surfaces 305 and the trench bottom surfaces 307 of the insulating material 304 by adjusting the properties of the deposition technique, for example. A relatively conformal deposition of a layer of Ta 342a/342b is then deposited over the exposed sidewalls 313 and over the layer 340 of TaN in the hexagonal phase. The Ta nucleates as low resistive alpha Ta 342a on the top surfaces 305 and the trench bottom surfaces 307, and nucleates as a higher resistive beta Ta 342b on the sidewalls 313 of the trenches 312, as shown. Advantageously, the alpha Ta 342a is fast grain growing and the beta Ta 342b is slow grain growing, e.g., for the conductive material that is later deposited over the layer of Ta 342a/342b (not shown in FIG. 7; see FIG. 6).

The layer 340 of TaN in the hexagonal phase preferably comprises a thickness of about 10 nm or less. The layer 342a of Ta in an alpha phase and the layer 342b of Ta in a beta phase preferably comprise a thickness of about 20 nm or less. Alternatively, the layers 340, 342a, and 342b may comprise other dimensions, for example.

Figure 8:
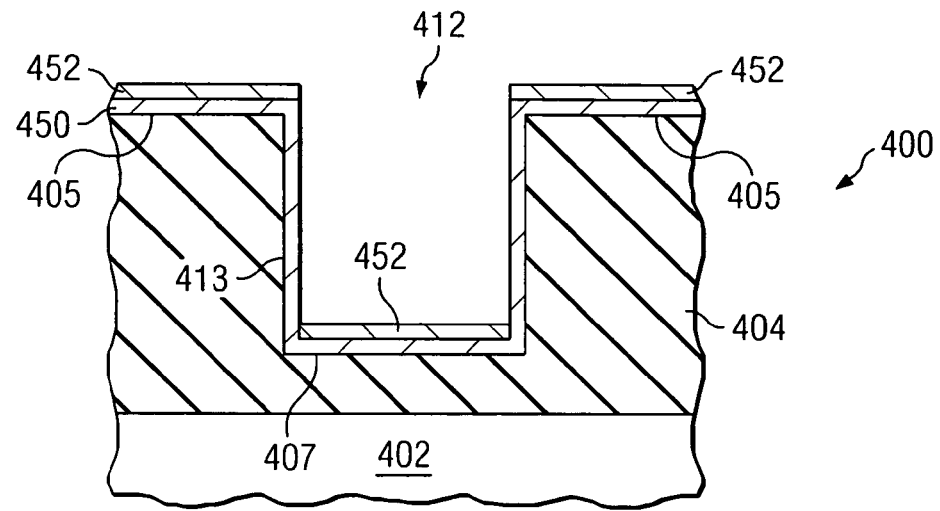
FIG. 8 shows a cross-sectional view of another embodiment of the present invention.

FIG. 8 shows another embodiment 400 of the present invention. In this embodiment, a relatively conformal layer 450 of TaN in a hexagonal phase is deposited over the trenches 412, over the top surfaces 405 and 407 and also over the sidewalls 413. Then a highly directional deposition process is used to deposit a layer 452 of alpha Ta over only the trench bottom 407 and the top surface 405 of the insulating material 404. The layer 452 is not formed over the sidewalls 413, as shown. Thus, the layer 452 of alpha Ta provides fast grain growth for the top surfaces 405 and 407, and the layer 450 of hexagonal TaN provides slow grain growth on the sidewalls 413, for the subsequently deposited conductive material (not shown in FIG. 8; see FIG. 6).

The layer 450 of TaN in a hexagonal phase preferably comprises a thickness of about 10 nm or less, and the layer 452 of Ta in an alpha phase preferably comprises a thickness of about 20 nm or less, although alternatively, the layers 450 and 452 may comprise other dimensions, for example.

The material layers 220, 222, 224, 226, 340, 342, 450, and 452 are preferably deposited using physical vapor deposition (PVD), although alternatively, the material layers 220, 222, 224, 226, 340, 342, 450, and 452 may be deposited using CVD, ALD, or other deposition methods, as examples.

Preferably, in accordance with embodiments of the present invention, the barrier material on the top surfaces of the insulating material is adapted to induce the grain growth of the conductive material at a first growth rate, and the barrier material on the sidewalls of the insulating material is adapted to induce the grain growth of the conductive material at a second growth rate, wherein the second growth rate is slower than the first growth rate. Thus, the grains of the conductive material formed in the trenches 212 are larger, reducing the resistance of the conductive features 230 formed, providing a higher conductivity.

Embodiments of the present invention include semiconductor devices including the structures described herein, and also include methods of manufacturing the semiconductor devices described, for example.

Embodiments of the present invention result in more uniform grain orientation in the favorable <111> texture in the trenches and/or vias. This <111> texture is the same as compared to the grains nucleated on planar surfaces on top of the insulating material. Because of the <111> texture, the narrow trenches and on top of planar dielectric surfaces during anneal there is a much higher probability, that during the subsequent anneal (e.g., between about 100° C.-400° C.) after electroplating of the conductive material, the small grains in narrow features will grow together with the larger grains in the excess copper area on top of the insulating material. This results in an elongation of the copper grains in narrow trenches with much reduced grain boundary scattering for conduction electrons and thus a reduced resistivity.

Copper grain growth depends on the under layer, i.e., the underlying barrier/liner material. A faster-growing barrier material, alpha Ta, is used on the top surfaces of insulating material in accordance with some embodiments of the present invention, but not on the sidewalls, to reduce competing grain growth within narrow features.

Figure 9:
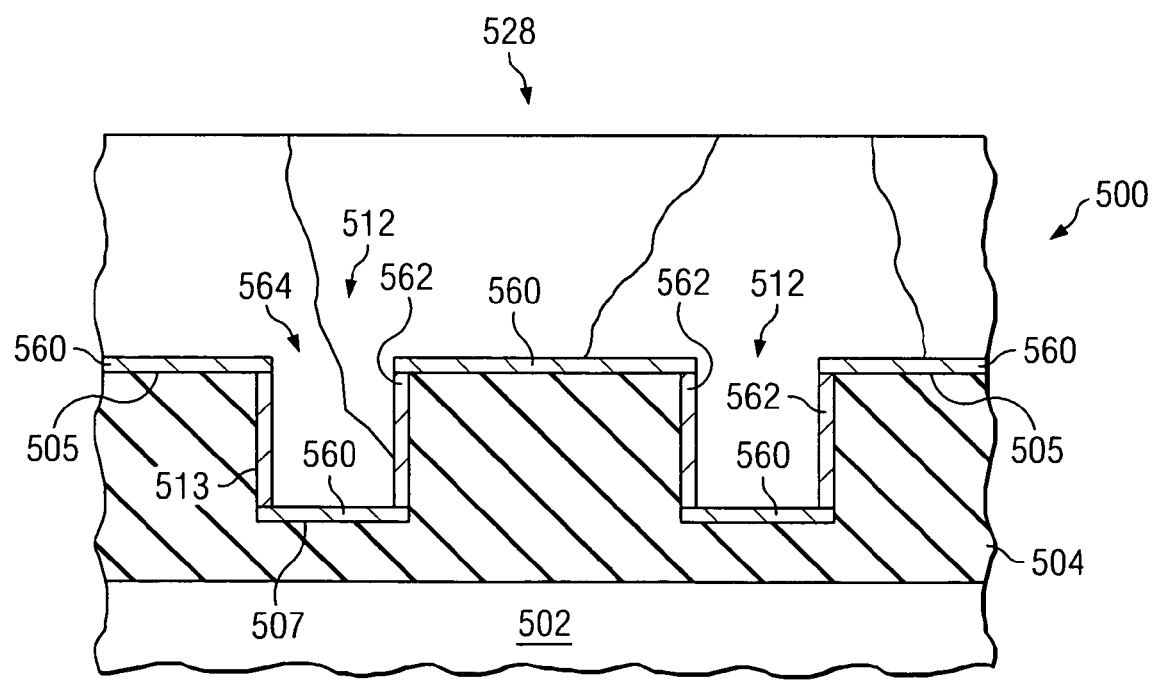
FIG. 9 is a cross-sectional view of a damascene structure fabricated in accordance with an embodiment of the present invention, wherein conductive material grains formed within trenches are large, resulting in decreased resistance of conductive features.

FIG. 9 is a cross-sectional view of a damascene structure fabricated in accordance with an embodiment of the present invention, wherein grains formed within trenches are large, resulting in decreased resistance of conductive features. Like numerals are used as were used in the previous drawings. A first barrier material 560 is formed over the top surfaces 505 and 507, and a second barrier material 562 comprising a different material than the first barrier material 560 and adapted to induce slower grain growth in a conductive material is formed over the sidewalls 513 of the trenches 512. The <111> textured conductive material, such as copper, grains nucleate at the trench 512 and via bottoms and on the planar surfaces 505 and 507 over the insulating material 504 can grow together to joint large grains 564, which are elongated and extend into the narrow trench 512 features. This leads to reduced grain boundary scattering and reduced resistivity of the conductive material 528, for example.

Advantages of preferred embodiments of the present invention include providing barrier layers wherein the barrier layer material is different on the sidewalls of trenches than at the top surfaces, inducing larger grain growth of the crystalline structure of conductive material within the trenches. The conductive features formed have a low resistance and thus have increased conductivity, enabling the manufacture of faster, higher performance integrated circuits. The methods described herein produce low resistive conductive wires and vias in extremely narrow dimensions. Suppression and reduction of an increase in conductive material resistivity is achieved by embodiments of the present invention. Larger grains with preferred <111> texture are realized in the conductive material. The conductive material also has a reduced number of grain boundaries.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    providing a workpiece;
    forming an insulating material over the workpiece, the insulating material having a first top surface;
    forming at least one trench in the insulating material, the at least one trench extending below the first top surface of the insulating material and comprising sidewalls, the at least one trench having a second top surface disposed at the bottom of the at least one trench;
    forming a first barrier material covering the trench, said first barrier material inducing grain growth of a conductive material at a first growth rate including a portion directly over the second top surface;
    forming a second barrier material over the sidewalls, subsequent to forming said first barrier material, such that said portion of the first barrier material directly over the second top surface at the bottom of the trench is exposed and the second barrier material over the sidewalls is exposed, wherein the second barrier material comprises a different material than the first barrier material and said second barrier material causing grain growth of said conductive material at a second growth rate, said growth rate slower than said first growth rate; and
    filling the at least one trench with said conductive material.

2. The method according to claim 1, wherein forming the first barrier material comprises forming a first layer of TaN in a hexagonal phase and forming a second layer of Ta in an alpha phase over the first layer of TaN in a hexagonal phase, wherein forming the second barrier material comprises forming the first layer of TaN in a hexagonal phase and forming the second layer of Ta in an alpha phase over the first layer of TaN in a hexagonal phase, and wherein forming the second barrier material further comprises forming a third barrier material over the second layer of Ta in an alpha phase, wherein the third barrier material comprises a different material than the second layer of Ta.

3. The method according to claim 2, wherein forming the third barrier material comprises forming WCN, TiN, TiSiN, TiZr, TiZrN, Ru, WN, W, CoWP, CoWB, NiMoP, TaN, or a material in an amorphous phase.

4. The method according to claim 1, further comprising forming a seed layer over the first barrier material and the second barrier material, before filling the at least one trench with the conductive material.

5. The method according to claim 1, wherein filling the at least one trench comprises filling the at least one trench with copper, aluminum, tungsten, silver, gold, or combinations or alloys thereof.

6. The method according to claim 1, further comprising annealing the workpiece at a temperature of about 100° C. to about 450° C.

7. The method according to claim 1, wherein forming the at least one trench in the insulating material comprises forming a single damascene or dual damascene structure.

8. The method according to claim 7, wherein filling the at least one trench with the conductive material comprises depositing the conductive material within the at least one trench and over the first top surface of the insulating material, further comprising removing the conductive material from over the first top surface of the insulating material.

9. The method according to claim 2, wherein the first layer of TaN in a hexagonal phase is formed to a thickness of about 10 nm or less, and wherein the second layer of Ta in an alpha phase is formed to a thickness of about 20 nm or less.

10. The method according to claim 2, wherein the third barrier material comprises a material in an amorphous phase.

11. The method according to claim 2, wherein the third barrier material comprises WCN.

12. The method according to claim 2, wherein the third barrier material comprises a crystalline material.

13. The method according to claim 2, wherein the third barrier material is formed to a thickness of about 2 nm or less.

14. The method according to claim 2, wherein the first layer of TaN in a hexagonal phase is formed to a thickness of about 10 nm or less, wherein the second layer of Ta in an alpha phase is formed to a thickness of about 20 nm or less, and wherein the layer of Ta in a beta phase is formed to a thickness of about 20 nm or less.

15. The method according to claim 2, wherein the first layer of TaN in a hexagonal phase is formed to a thickness of about 10 nm or less, and wherein the second layer of Ta in an alpha phase is formed to a thickness of about 20 nm or less.

16. The method according to claim 5, wherein the conductive material comprises copper.

17. The method according to claim 1, wherein the first barrier material or the second barrier material comprise two or more material layers.

* * * * *

UNITED STATES PATENT AND TRADEMARK OFFICE
CERTIFICATE OF CORRECTION

PATENT NO. : 7,449,409 B2 Page 1 of 1
APPLICATION NO. : 11/079738
DATED : November 11, 2008
INVENTOR(S) : Barth et al.

It is certified that error appears in the above-identified patent and that said Letters Patent is hereby corrected as shown below:

On the Title Page, Item (54), delete "LAYER" and insert --LAYERS--.

In Col. 1, line 1, delete "LAYER" and insert --LAYERS--.

Signed and Sealed this

Seventeenth Day of February, 2009

JOHN DOLL
*Acting Director of the United States Patent and Trademark Office*